(12) United States Patent
Yu et al.

(10) Patent No.: US 11,728,438 B2
(45) Date of Patent: Aug. 15, 2023

(54) SPLIT-GATE MEMORY DEVICE AND METHOD OF FORMING SAME

(71) Applicant: Shanghai Huahong Grace Semiconductor Manufacturing Corporation, Shanghai (CN)

(72) Inventors: Tao Yu, Shanghai (CN); Binghan Li, Shanghai (CN)

(73) Assignee: Shanghai Huahong Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 17/236,493

(22) Filed: Apr. 21, 2021

(65) Prior Publication Data
US 2022/0310845 A1    Sep. 29, 2022

(30) Foreign Application Priority Data

Mar. 24, 2021 (CN) .......................... 202110313048.8

(51) Int. Cl.
*H01L 29/788* (2006.01)
*H01L 21/28* (2006.01)
*H01L 29/423* (2006.01)
*H01L 29/66* (2006.01)

(52) U.S. Cl.
CPC .... *H01L 29/7881* (2013.01); *H01L 29/40114* (2019.08); *H01L 29/42332* (2013.01); *H01L 29/66825* (2013.01)

(58) Field of Classification Search
None
See application file for complete search history.

(56) References Cited

U.S. PATENT DOCUMENTS

| | | | |
|---|---|---|---|
| 2005/0104232 A1* | 5/2005 | Shih | H10B 41/10 257/296 |
| 2009/0090963 A1* | 4/2009 | Isobe | H10B 41/35 257/326 |
| 2020/0013888 A1* | 1/2020 | Su | H01L 29/0653 |

* cited by examiner

*Primary Examiner* — Xiaoming Liu
(74) *Attorney, Agent, or Firm* — Murtha Cullina LLP

(57) ABSTRACT

A substrate in a split-gate memory device has a memory cell region including a connecting subregion and a functional subregion. A source region is formed in the substrate, and first and second gate structures mirrored to each other are formed on the substrate on opposing sides of the source region. In the connecting subregion, control gates of the first and second gate structures and the source region are electrically connected by electrical connections. In the split-gate memory device, the arrangement of the functional and connecting subregions in the memory cell region and external connection of the control gates in the first and second gate structures and the source region in the connecting subregion, which are exposed by etching, by the electrical connections in the connecting subregion result in area savings of the memory cell region.

9 Claims, 6 Drawing Sheets

SPLIT-GATE MEMORY DEVICE AND METHOD OF FORMING SAME

CROSS-REFERENCE TO RELATED APPLICATION

This application claims the priority of Chinese patent application number 202110313048.8, filed on Mar. 24, 2021, the entire contents of which are incorporated herein by reference.

TECHNICAL FIELD

The present invention relates to the field of integrated circuit fabrication and, in particular, relates to a split-gate memory device and a method of forming such a device.

BACKGROUND

Flash memory devices can be categorized into stacked-gate and split-gate ones based on their structure. FIG. 1 schematically illustrates the structure of an existing split-gate memory device. As shown, the split-gate memory device has a memory cell region including a substrate 100, on which there are formed an erase gate 130 and first and second gate structures on opposing sides of the erase gate 130. The first gate structure includes a floating gate 111 above the substrate 100 and a control gate 121 above the floating gate 111. The second gate structure includes a floating gate 112 above the substrate 100 and a control gate 122 above the floating gate 112. In addition, the second gate structure is mirrored to the first gate structure. A word line 141 is formed at the side of the first gate structure away from the erase gate 130, and a word line 142 is formed at the side of the second gate structure away from the erase gate 130. In terms of erasing performance, split-gate memory devices surpass their stacked-gate counterparts because of their immunity from the problem of overerasing.

With semiconductor devices evolving toward higher integration, shrinkage of split-gate memory devices are increasingly demanded. However, in the split-gate memory device shown in FIG. 1, the control gates 121, 122 must be wired out in order to be able to control the respective floating gates 111, 112. This requires an additional wiring space in the memory cell region and an additional area in an associated peripheral control gate decoder circuit, and is thus unfavorable to the miniaturization of the split-gate memory device.

SUMMARY OF THE INVENTION

It is an objective of the present invention to provide a split-gate memory device and a method of forming such a device, which allow shrinkage of a wire space and area of a memory cell region of the split-gate memory device.

According to the present invention, the above objective is attained by a split-gate memory device, including a substrate, having a memory cell region including a connecting subregion and a functional subregion; first and second gate structures provided in the memory cell region, each of the first and second gate structures including a floating gate on the substrate, an inter-gate dielectric layer on the floating gate and a control gate on the inter-gate dielectric layer, the second gate structure being mirrored to the first gate structure; a source region provided in the substrate between the first and second gate structures; and electrical connections, including first electrical connections and a second electrical connection, wherein in the connecting subregion, the first electrical connections connect the control gates of the first and second gate structures, the second electrical connection connects the source region, and the first electrical connections are electrically connected to the second electrical connection.

Optionally, each of the first and second gate structures may further include a first spacer and a second spacer, the first spacer residing on the inter-gate dielectric layer and covering a side of the control gate close to the source region, the second spacer residing on the substrate and covering a side of each of the first spacer, the control gate and the inter-gate dielectric layer close to the source region.

Optionally, each of the first and second gate structures may further include a third spacer which covers a side of each of the floating gate, the inter-gate dielectric layer and the control gate away from the source region.

Optionally, in the functional subregion, a protective layer may be provided on the control gate of each of the first and second gate structures, the protective layer in the shape of a wedge having a vertical surface away from the source region and a bevel surface close to the source region, the bevel surface covered partially by the first spacer and partially by the second spacer, the vertical surface covered by the third spacer.

Optionally, in the functional subregion, the second spacer further may cover a surface of the substrate between the first and second gate structures.

Optionally, in the functional subregion, an erase gate may be provided on the second spacer between the first and second gate structures.

Optionally, in the functional subregion, an erase gate protective layer may be formed on the erase gate.

Optionally, in the functional subregion, each third spacer may be covered by a word line and a word line spacer.

Optionally, in the functional subregion, a drain region may be formed in the substrate on a side of the word line away from the source region.

Optionally, the electrical connections may further include third electrical connections connecting the drain regions.

Optionally, the split-gate memory device may further include an interlayer dielectric layer and a metal layer residing on the interlayer dielectric layer, the interlayer dielectric layer covering the substrate, the first gate structure and the second gate structure, wherein the first electrical connections penetrate through the interlayer dielectric layer to connect the respective control gate to the metal layer, wherein the second electrical connection penetrates through the interlayer dielectric layer to connect the source region to the metal layer, wherein the third electrical connections penetrate through the interlayer dielectric layer to connect the respective drain regions to the metal layer, and wherein the first electrical connections are electrically connected to the second electrical connection via the metal layer.

Optionally, a gate oxide layer may be further formed between the floating gate in each of the first and second gate structures and the substrate.

According to the present invention, the above objective is also attained by a method of forming a split-gate memory device, including providing a substrate having a memory cell region including a connecting subregion and a functional subregion; successively forming a floating gate material layer, a first dielectric layer, a control gate material layer and a hard mask layer over the substrate; etching the hard mask layer to form therein a first opening in which the control gate material layer is partially exposed and forming protective layers on side walls of the first opening with the hard mask layer and the protective layers together serving as an etch mask, etching the control gate material layer to form therein a second opening in which the first dielectric layer is partially exposed and forming first spacers on side walls of the second opening with the hard mask layer, the protective layers and the first spacers together serving as an etch mask, etching the first dielectric layer and the floating gate material layer to form therein a third opening in which the substrate is partially exposed and forming a source region in the substrate exposed in the third opening and a second spacer over side walls and a bottom of the third opening forming an erase gate within the third opening; removing the hard mask layer and the underlying control gate material layer, first dielectric layer and floating gate material layer, thereby forming first and second gate structures, each of which includes a control gate, an inter-gate dielectric layer and a floating gate, and which are mirrored to each other and located on opposing sides of the source region in the connecting subregion, removing the erase gate, the protective layers, portions of the first and second spacers covering the protective layers and a portion of the second spacer covering the source region, thus exposing the control gates of the first and second gate structures and the source region; and forming electrical connections including first electrical connections and a second electrical connection, the first electrical connections connecting the control gates of the first and second gate structures, the second electrical connection connecting the source region, the first electrical connections being electrically connected to the second electrical connection.

Optionally, subsequent to the removal of the hard mask layer and the underlying control gate material layer, first dielectric layer and floating gate material layer, the method may further include: forming third spacers on sides of the floating gates, inter-gate dielectric layers and control gates away from the source region; and removing portions of the third spacers covering the protective layers during the etching process for exposing the control gates of the first and second gate structures and the source region.

Optionally, subsequent to the formation of the third spacers, the method may further include: forming word lines on sides of the third spacers away from the source region; and removing the word lines in the connecting subregion during the etching process for exposing the control gates of the first and second gate structures and the source region.

Optionally, subsequent to the exposure of the control gates of the first and second gate structures and the source region accomplished by the etching process, the method may further include performing an ion implantation process in the functional subregion and thereby forming drain regions in the substrate on sides of the word lines away from the source region, wherein the electrical connections further include third electrical connections connecting the drain regions.

Optionally, prior to the formation of the drain regions, in the functional subregion, word line spacers may be formed on the sides of the word lines away from the source region.

Optionally, prior to the formation of the electrical connections, the method may further include forming an interlayer dielectric layer on the substrate, which covers the first and second gate structures in the connecting subregion and covers the word line spacers, the word lines, the second spacer and the erase gate protective layer in the functional subregion.

Optionally, a metal layer may be formed on the interlayer dielectric layer, wherein the first electrical connections penetrate through the interlayer dielectric layer to connect the control gates to the metal layer, wherein the second electrical connection penetrates through the interlayer dielectric layer to connect the source region to the metal layer, wherein the third electrical connections penetrate through the interlayer dielectric layer to connect the drain regions to the metal layer, and wherein the first electrical connections are electrically connected to the second electrical connection via the metal layer.

In summary, the present invention provides a split-gate memory device and a method for forming such a device. A substrate in the split-gate memory device has a memory cell region including a connecting subregion and a functional subregion. On the substrate, there are provided first and second gate structures that are mirrored to each other, and there is a source region in the substrate between the first and second gate structures. In the connecting subregion, control gates of the first and second gate structures and the source region are electrically connected by electrical connections. In the split-gate memory device of the present invention, the arrangement of the functional and connecting subregions in the memory cell region and external connection of the control gates in the first and second gate structures and the source region, which are exposed by etching, by the electrical connections in the connecting subregion result in area savings of the memory cell region by eliminating the need for reserving a separate wiring space in the memory cell region for the control gates and dispense with the use of a peripheral control gate decoder circuit, thus achieving a simplified circuit design, when compared with the prior art. Moreover, the method of the present invention is simple and designed to circumvent additional photomask costs.

DETAILED DESCRIPTION

Specific embodiments of the present invention will be described below in greater detail with reference to the accompanying drawings. Features and advantages of the invention will be more apparent from the following description. Note that the accompanying drawings are provided in a very simplified form not necessarily drawn to scale, and their only intention is to facilitate convenience and clarity in explaining the disclosed embodiments.

Figure 1:
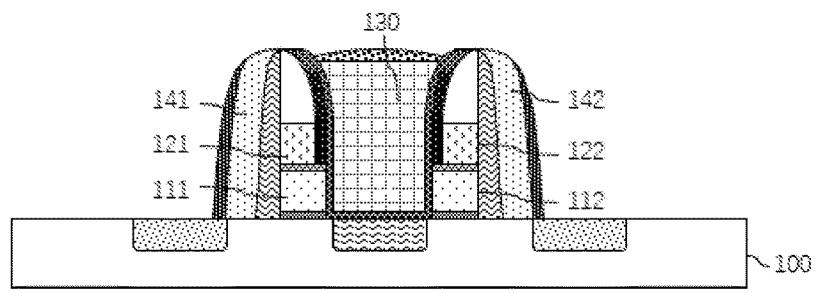
FIG. 1 is a structural schematic of a known split-gate memory device.
Figure 2:
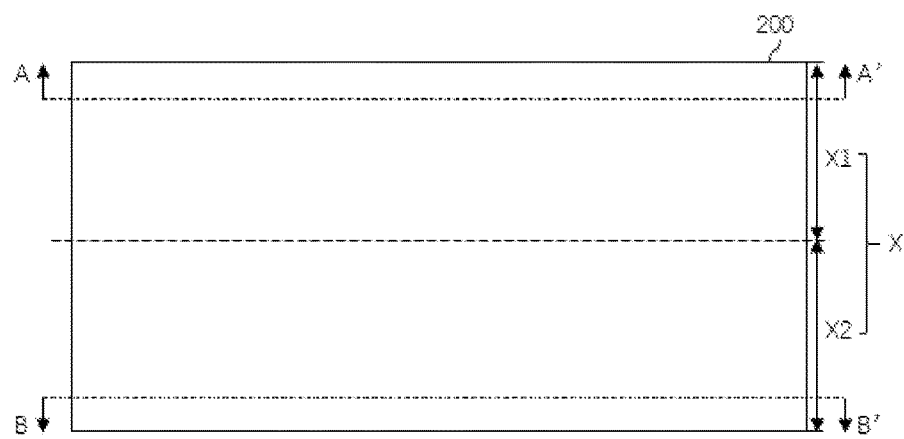
FIG. 2 shows a schematic top view of a memory cell region in a split-gate memory device according to an embodiment of the present invention.
Figure 3:
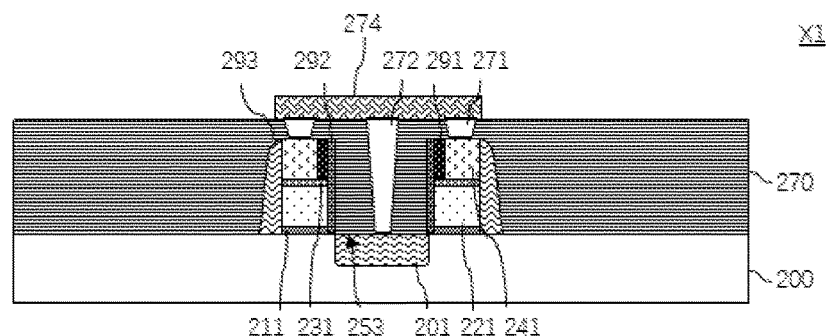
FIG. 3 shows a schematic cross-sectional view of a connecting subregion in a split-gate memory device according to an embodiment of the present invention.
Figure 4:
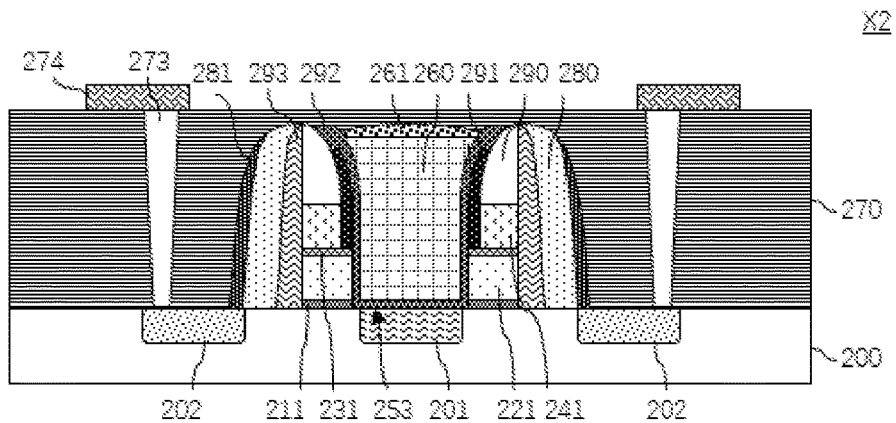
FIG. 4 shows a schematic cross-sectional view of a functional subregion in a split-gate memory device according to an embodiment of the present invention.

FIG. 2 is a schematic top view of a memory cell region in a split-gate memory device according to an embodiment of the present invention. FIG. 3 is a schematic cross-sectional view of a connecting subregion X1 in FIG. 2 taken along line AA', and FIG. 4 is a schematic cross-sectional view of a functional subregion X2 in FIG. 2 taken along line BB'. Referring to FIGS. 2 to 4, the split-gate memory device includes: a substrate 200, having a memory cell region including a connecting subregion and a functional subregion; first and second gate structures provided in the memory cell region, each including a floating gate 221 above the substrate 200, an inter-gate dielectric layer 231 on the floating gate 221, and a control gate 241 on the inter-gate dielectric layer 231, the second gate structure being mirrored to the first gate structure; a source region 201 provided in the substrate 200 between the first and second gate structures; and electrical connections, including first electrical connections 271 (respectively provided in the first and second gate structures) and a second electrical connection 272. In the connecting subregion, the first electrical connections 271 connect the respective control gates 241 of the first and second gate structures, and the second electrical connection 272 connects the source region 201. The first electrical connections 271 are electrically connected to the second electrical connection 272.

In this embodiment, the substrate 200 is a silicon substrate. In other embodiments of the present invention, the substrate 200 may be made of at least one of Si, Ge, SiGe, SiC, SiGeC, InAs, GaAs, InP and other III/V compound semiconductors. The substrate 200 may also be a laminated structure made of one or more of the above materials. Alternatively, the substrate 200 may a silicon-on-insulator (SOI) substrate, a strained-silicon-on-insulator (sSOI) substrate, a strained-silicon-germanium-on-insulator (sSiGeOI) substrate, a silicon-germanium-on-insulator (SiGeOI) substrate, a germanium-on-insulator (GeOI) substrate or the like. The present invention is not limited in this regard. Optionally, the inter-gate dielectric layer 231 may be a lamination of a silicon oxide layer, a silicon nitride layer and another silicon oxide layer. In this embodiment, in each of the first and second gate structures, a gate oxide layer 211 is provided between the floating gate 221 and the substrate 200.

With reference to FIGS. 3 and 4, each of the first and second gate structures may further include a first spacer 291 and a second spacer 292. The first spacer 291 may reside on the inter-gate dielectric layer 231 and cover a side of the control gate 241 close to the source region 201, and the second spacer 292 may reside on the substrate 200 and cover a side of each of the first spacer 291, the control gate 241 and the inter-gate dielectric layer 231 close to the source region 201. Optionally, each of the first and second gate structures may further include a third spacer 293 covering a side of each of the floating gate 221, the inter-gate dielectric layer 231 and the control gate 241 away from the source region 201. In this embodiment, the first spacer 291 is a lamination of a silicon oxide layer and a silicon nitride layer, and each of the second spacer 292 and the third spacer 293 is a silicon oxide layer. In other embodiments of the present invention, each of the first spacer 291, the second spacer 292 and the third spacer 293 may be made of a different material or structure otherwise, and the present invention is not limited in this regard.

With reference to FIG. 4, in the functional subregion, a protective layer 290 may be further provided on the control gate 241 of each of the first and second gate structures. The protective layer 290 may be in the shape of a wedge having a vertical surface away from the source region 201 and a bevel surface close to the source region 201. The bevel surface may be covered partially by the first spacer 291 and partially by the second spacer 292, and the vertical surface may be covered by the third spacer 293. Optionally, the protective layer 290 may be made of a material including silicon oxide. The second spacer 292 may further cover a surface of the substrate 200 between the first and second gate structures. An erase gate 260 may be provided on the second spacer 292 between the first and second gate structures. Optionally, an erase gate protective layer 261 may be formed on the erase gate 260. The functional subregion may further include word lines 280 and word line spacers 281 covering the respective third spacers 293. A drain region 202 may be formed in the substrate 200 on a side of each word line 280 away from the source region 201. Optionally, the electrical connections may further include third electrical connections 273 connecting the drain regions 202.

With continued reference to FIGS. 3 and 4, the split-gate memory device may further include an interlayer dielectric layer 270 covering both the first and second gate structures and a metal layer 274 on the interlayer dielectric layer 270. The first electrical connections 271 may penetrate through the interlayer dielectric layer 270 to connect the respective control gates 241 to the metal layer 274, and the second electrical connection 272 may penetrate through the interlayer dielectric layer 270 to connect the source region 201 to the metal layer 274. The third electrical connections 273 may penetrate through the interlayer dielectric layer 270 to connect the respective drain regions 202 to the metal layer 274, and the first electrical connections 271 may be electrically connected to the second electrical connection 272 via the metal layer 274.

Figure 5:
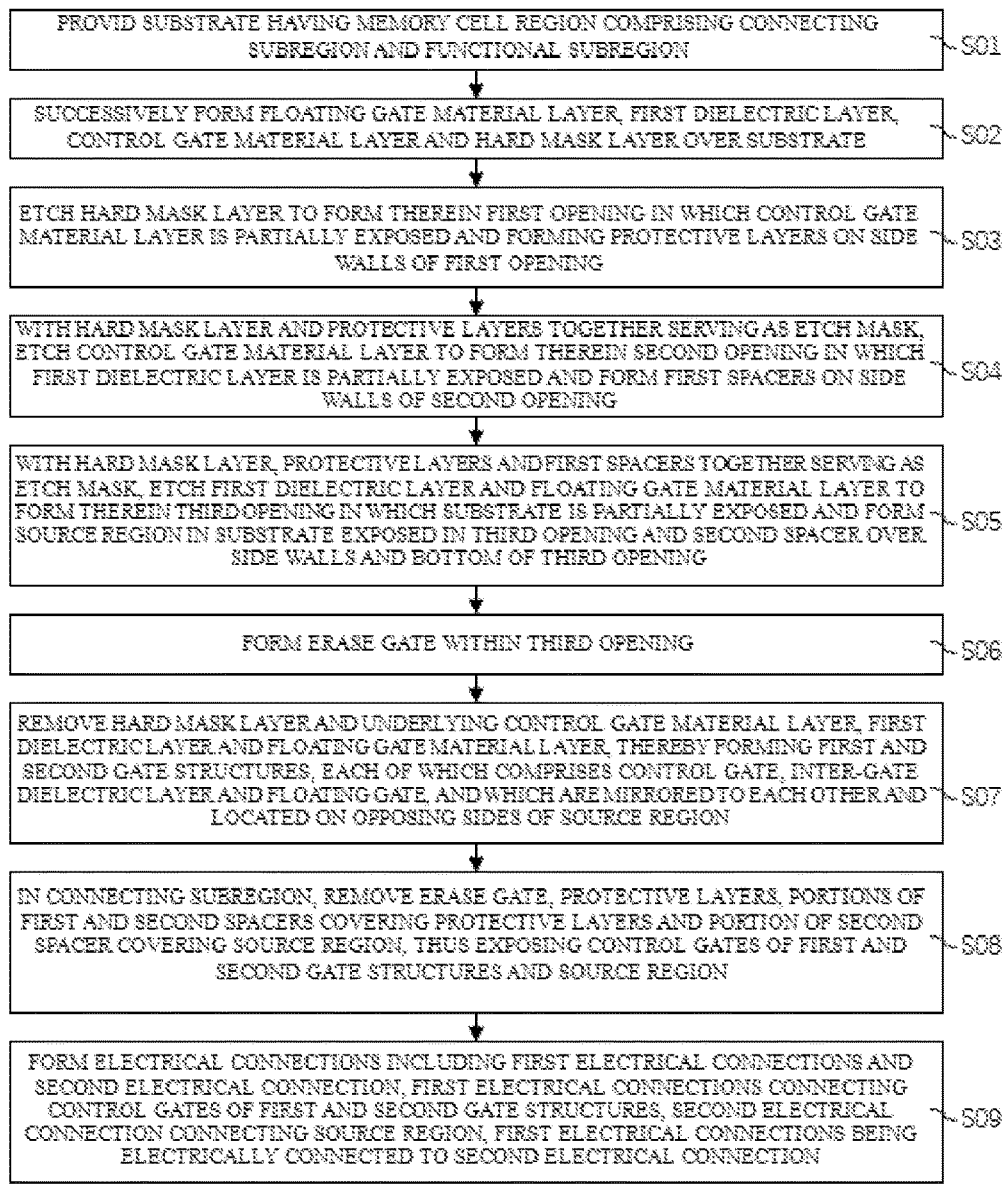
FIG. 5 is a flowchart of a method of forming a split-gate memory device according to an embodiment of the present invention.

FIG. 5 shows a flowchart of a method of forming a split-gate memory device as defined above. As shown, the method includes the steps of: S01) providing a substrate having a memory cell region including a connecting subregion and a functional subregion; S02) successively forming a floating gate material layer, a first dielectric layer, a control gate material layer and a hard mask layer over the substrate; S03) etching the hard mask layer to form therein a first opening in which the control gate material layer is partially exposed and forming protective layers on side walls of the first opening; S04) with the hard mask layer and the protective layers together serving as an etch mask, etching the control gate material layer to form therein a second opening in which the first dielectric layer is partially exposed and forming first spacers on side walls of the second opening; S05) with the hard mask layer, the protective layers and the first spacers together serving as an etch mask, etching the first dielectric layer and the floating gate material layer to form therein a third opening in which the substrate is partially exposed and forming a source region in the substrate exposed in the third opening and a second spacer over side walls and a bottom of the third opening; S06) forming an erase gate within the third opening; S07) removing the hard mask layer and the underlying control gate material layer, first dielectric layer and floating gate material layer, thereby forming first and second gate structures, each of which includes a control gate, an inter-gate dielectric layer and a floating gate, and which are mirrored to each other and located on opposing sides of the source region; S08) in the connecting subregion, removing the erase gate, the protective layers, portions of the first and second spacers covering the protective layers and a portion of the second spacer covering the source region, thus exposing the control gates of the first and second gate structures and the source region; and S09) forming electrical connections including first electrical connections and a second electrical connection, the first electrical connections connecting the control gates of the first and second gate structures, the second electrical connection connecting the source region, the first electrical connections being electrically connected to the second electrical connection.

FIGS. 6 to 20 are schematic diagrams of structures resulting from steps in a method of forming a split-gate memory device as defined above. The method will be described in detail below with reference to FIGS. 6 to 20.

Figure 6:
FIGS. 6 to 20 are schematic diagrams of structures resulting from steps in a method of forming a split-gate memory device according to an embodiment of the present invention.

At first, referring to FIG. 6, in step S01, a substrate 200 is provided, which has a memory cell region X including a connecting subregion X1 and a functional subregion X2. In this embodiment, the substrate 200 is a silicon substrate. In other embodiments of the present invention, the substrate 200 may be made of at least one of Si, Ge, SiGe, SiC, SiGeC, InAs, GaAs, InP and other HIRT compound semiconductors. The substrate 200 may also be a laminated structure made of one or more of the above materials. Alternatively, the substrate 200 may a silicon-on-insulator (SOI) substrate, a strained-silicon-on-insulator (sSOI) substrate, a strained-silicon-germanium-on-insulator (sSiGeOI) substrate, a silicon-germanium-on-insulator (SiGeOI) substrate, a germanium-on-insulator (GeOI) substrate or the like. The present invention is not limited in this regard.

Figure 7:
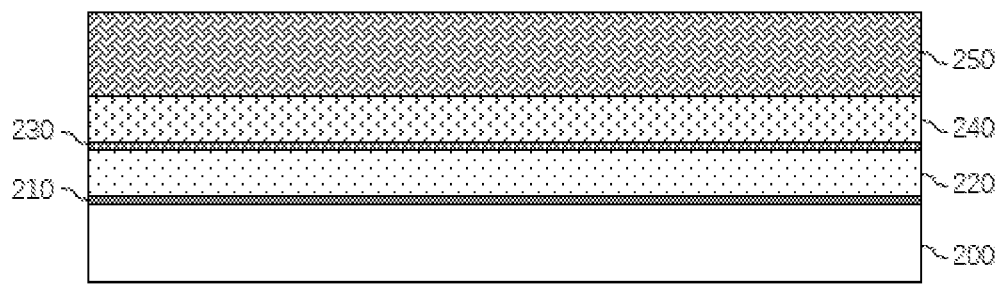

Next, referring to FIG. 7, in step S02, a floating gate material layer 220, a first dielectric layer 230, a control gate material layer 240 and a hard mask layer 250 are successively formed over the substrate 200. Optionally, a second dielectric layer 210 may be further formed between the floating gate material layer 220 and the substrate 200. The second dielectric layer 210 may be a silicon oxide layer. In this embodiment, the first dielectric layer 230 is an ONO lamination of a silicon oxide layer, a silicon nitride layer and another silicon oxide layer, and the hard mask layer 250 is a silicon nitride layer.

Figure 8:
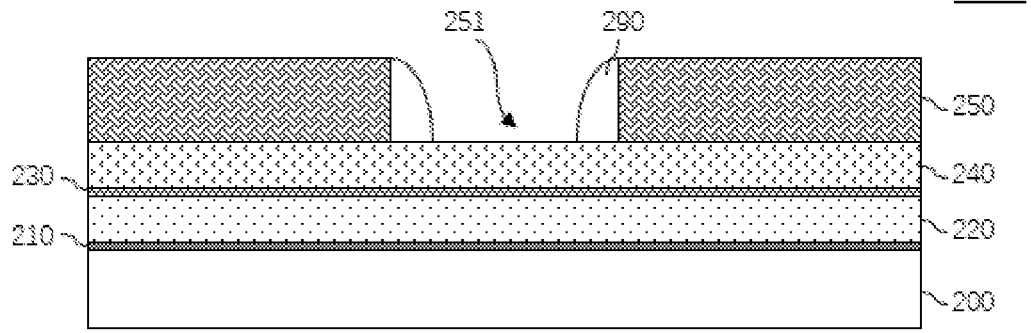

Referring to FIG. 8, in step S03, the hard mask layer 250 is etched to form therein a first opening 251, in which the underlying control gate material layer 240 is partially exposed, and a protective layer 290 is formed over each side wall of the first opening 251. In this embodiment, the protective layer 290 is in the shape of a wedge having a vertical surface covering the side wall and a bevel surface exposed in the first opening 251. Optionally, the protective layer 290 may be a silicon oxide layer.

Figure 9:
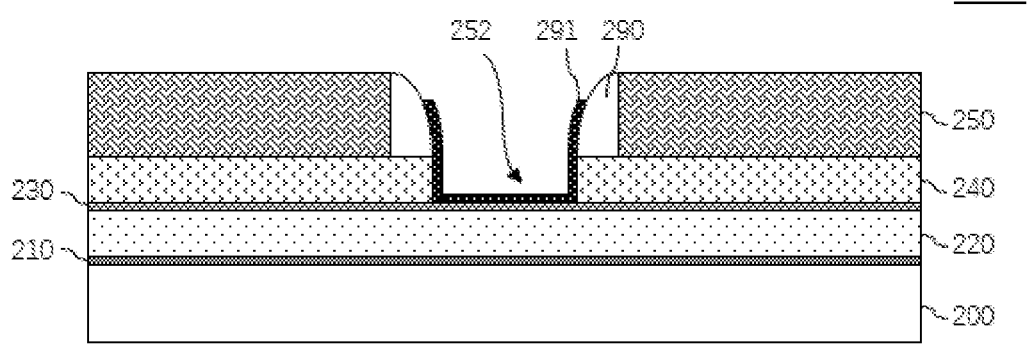

Referring to FIG. 9, in step S04, under the protection of the hard mask layer 250 and the protective layers 290, the control gate material layer 240 is etched to form therein a second opening 252, in which the first dielectric layer 230 is partially exposed. A first spacer 291 is then so formed over each side wall of the second opening 252 that it further covers part of the bevel surface of the protective layer 290. In this embodiment, the first spacer 291 is a lamination of a silicon oxide layer and a silicon nitride layer. In other embodiments of the present invention, the first spacer 291 may also be a silicon oxide layer or a silicon nitride layer, as practically required, and the present invention is not limited in this regard.

Figure 10:
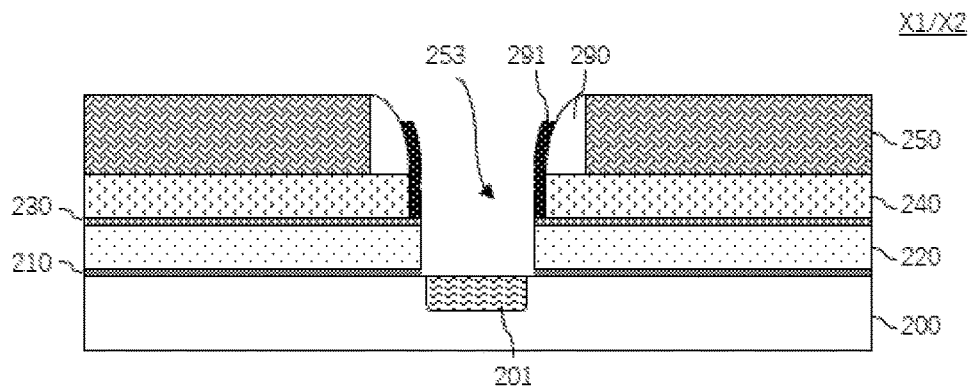
Figure 11:
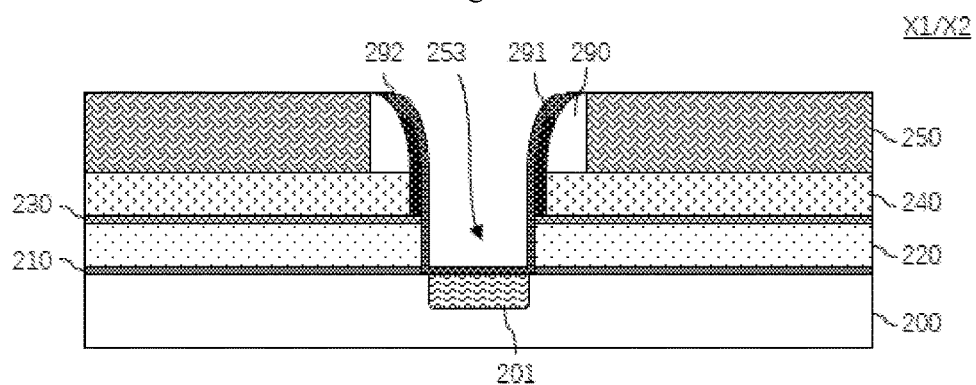

Referring to FIGS. 10 and 11, in step S05, under the protection of the hard mask layer 250, the protective layers 290 and the first spacers 291, the first dielectric layer 230 and the floating gate material layer 220 are etched to formed therein a third opening 253, in which the substrate 200 is partially exposed. A source region 201 is formed in the substrate 200 exposed in the third opening 253, and a second spacer 292 deposited over the side walls and bottom of the third opening 253. It is to be noted that, in case of the second dielectric layer 210 being present, following the first dielectric layer 230 and the floating gate material layer 220 being etched through, the second dielectric layer 210 is further etched to form the third opening 253 in which the underlying substrate 200 is exposed, and the source region 201 may be formed using an ion implantation process performed on the substrate 200 in the third opening. In this embodiment, the formed second spacer 292 covers both the first spacers 291 and bevel surface portions of the protective layers 290 uncovered by the first spacers 291. Optionally, the second spacer 292 may be a silicon oxide layer.

Figure 12:
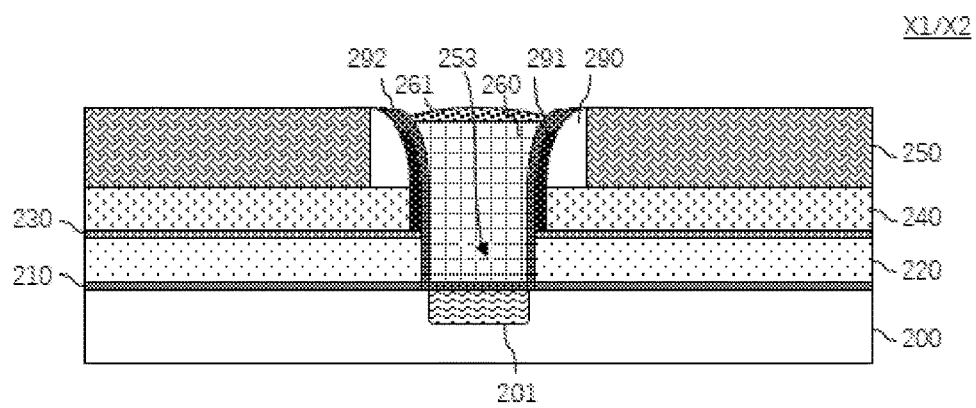

Referring to FIG. 12, in step S06, an erase gate 260 is formed in the third opening 253. In particular, the formation of the erase gate 260 may include: depositing an erase gate material layer (not shown), which fills up the third opening 253 and extends over the second spacer 292 and the hard mask layer 250; and planarizing the erase gate material layer, thus resulting in the formation of the erase gate 260. Optionally, the planarization of the erase gate material layer may be accomplished by a chemical mechanical polishing (CMP) process. In this embodiment, a top surface of the resulting erase gate 260 is lower than that of the hard mask layer 250. In other embodiments of the present invention, the two top surfaces may also be flush with each other. Optionally, subsequent to the formation of the erase gate 260, an erase gate protective layer 261 may be grown on the top surface of the erase gate 260 using a thermal oxidation process. The erase gate protective layer 261 may be a silicon oxide layer.

Figure 13:
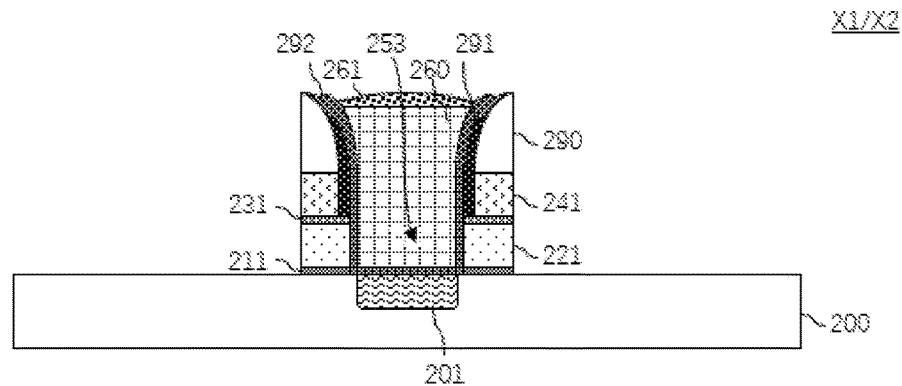

Referring to FIG. 13, in step S07, the hard mask layer 250 and the underlying control gate material layer 240, the first dielectric layer 230 and the floating gate material layer 220 are removed, resulting in the formation of first and second gate structures, which are mirrored to each other and each include a control gate 241, an inter-gate dielectric layer 231 and a floating gate 221. Specifically, the hard mask layer 250 and the underlying control gate material layer 240, the first dielectric layer 230, the floating gate material layer 220 and the second dielectric layer 210 (if present) may be etched away under the protection of the second spacer 292 over the bevel surfaces of the protective layer 260 and the erase gate protective layer 261 so that the first and second gate structures each including a control gate 241, an inter-gate dielectric layer 231, a floating gate 221 and a gate oxide layer 211 are formed on opposing sides of the source region 201, which are symmetric (mirrored) to each other with respect to the source region 201.

Figure 14:
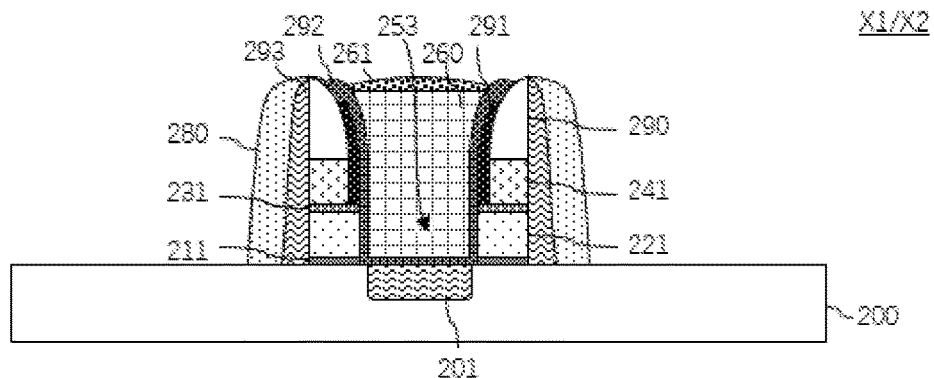

Optionally, referring to FIG. 14, subsequent to step S07 and prior to step S08, the method may further include forming third spacers 293 on sides of the floating gates 221, the inter-gate dielectric layers 231 and the control gates 241 away from the source region 201 and the word lines 280 on sides of the third spacers 293 away from the source region 201.

It is to be noted that, in each of the steps from the beginning of step S01 to the formation of the word lines 280, the split-gate memory device being fabricated is structured identically in the functional and connecting subregions X2, X1.

Figure 15:
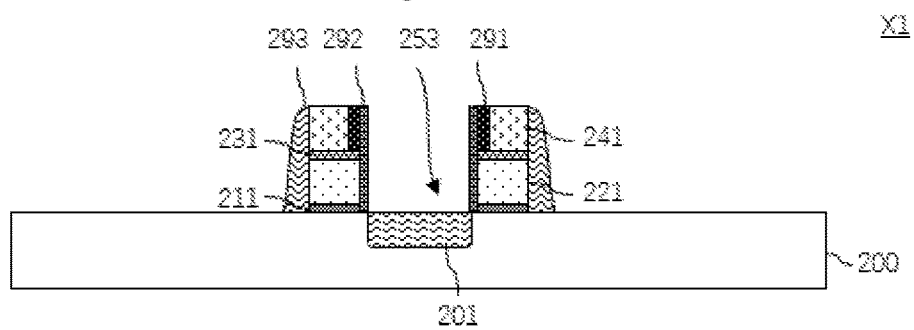

Afterward, referring to FIG. 15, in step S08, portions of the erase gate 260, the protective layers 290, the first and second spacers 291, 292 covering the protective layers 290 and the second spacer 292 covering the source region 201 of the first and second gate structures in the connecting subregion X1 are removed, exposing the control gates 241 and the source region 201. The exposure of the control gates 241 and the source region 201 of the first and second gate structures in the connecting subregion X1 may be accomplished using an etching process, in which portions of the word lines 280 and the third spacers 293 covering the protective layers 290 in the subregion may also be removed, and optionally, the structure in the functional subregion X2 may be protected from any damage by forming a photoresist layer (not shown) on the surface of the functional subregion X2.

Figure 16:
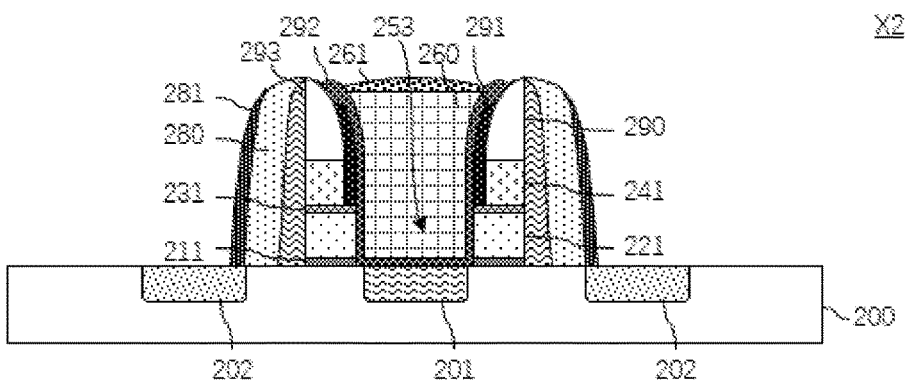

Referring to FIG. 16, subsequent to the exposure of the control gates 241 and the source region 201 of the first and second gate structures in the connecting subregion X1 by etching, the method may further include performing an ion implantation process in the functional subregion X2 to form drain regions 202 in the substrate 200 on sides of the word lines 280 away from the source region 201. In this embodiment, the method further includes, prior to the formation of the drain regions, forming word line spacers 281 on the sides of the word lines 280 away from the source region 201. Optionally, the word line spacers 281 may be silicon oxide layers.

Subsequently, referring to FIGS. 17 to 20, in step S09, electrical connections are formed, which include first electrical connections 271 connecting the control gates 241 in the first and second gate structures and a second electrical connection 272 connecting the source region 201. The first electrical connections 271 are electrically connected to the second electrical connection 272. In the functional subregion X2, the electrical connections may further include third electrical connections 273 connecting the drain regions 202.

Figure 17:
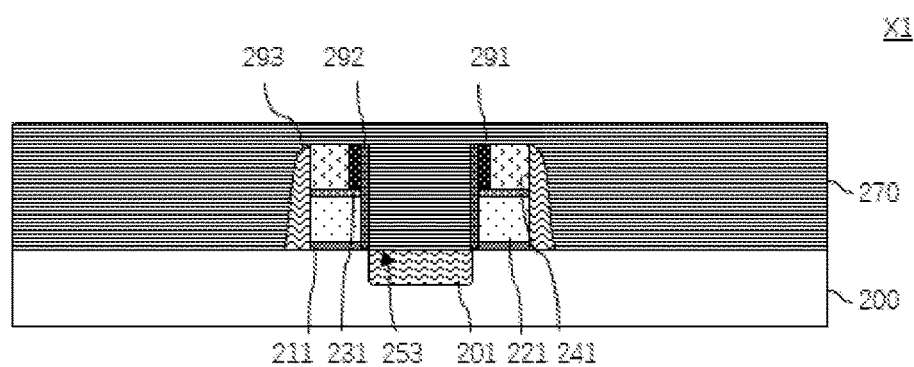
Figure 18:
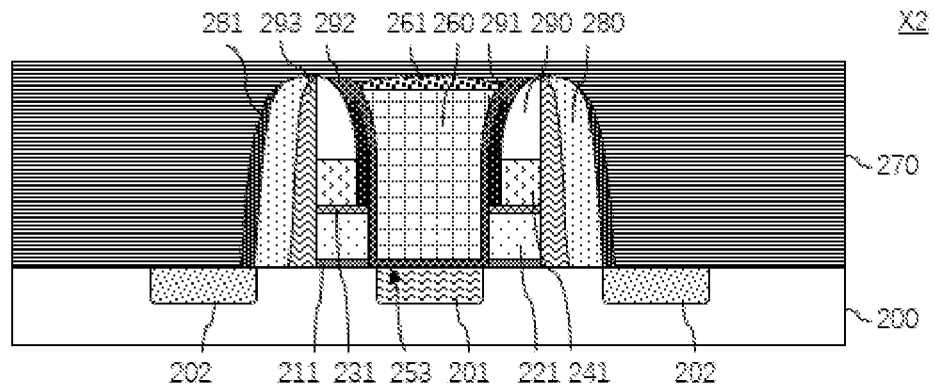

Prior to the formation of the electrical connections, the method may further include forming an interlayer dielectric layer 270 on the substrate 200. FIG. 17 shows a schematic cross-sectional view of the connecting subregion X1 subsequent to the formation of the interlayer dielectric layer, and FIG. 18 shows a schematic cross-sectional view of the functional subregion X2 subsequent to the formation of the interlayer dielectric layer. As shown in FIG. 17, the interlayer dielectric layer 270 covers the first and second gate structures in the connecting subregion X1. As shown in FIG. 18, the interlayer dielectric layer 270 covers the word line spacers 281, the word lines 280, the second spacer 292 and the erase gate protective layer 261 in the functional subregion X2.

Figure 19:
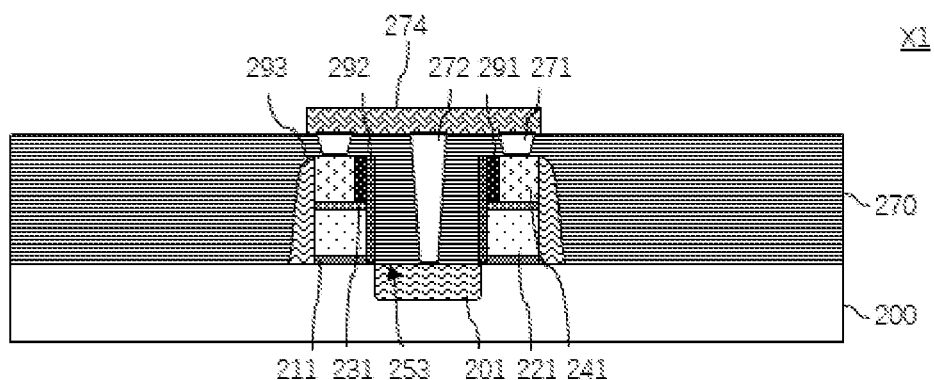
Figure 20:
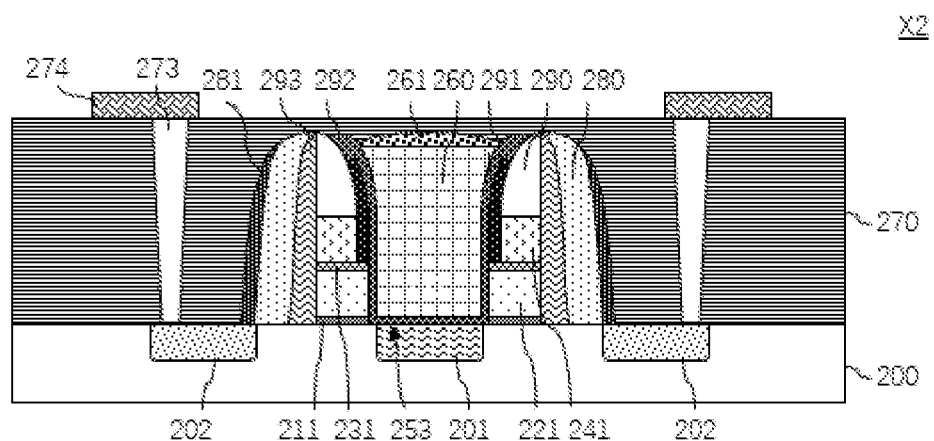

Referring to FIGS. 19 and 20, a metal layer 274 is formed on the interlayer dielectric layer 270 so that the first electrical connections 271 penetrate through the interlayer dielectric layer 270 to connect the control gates 241 to the metal layer 274, with the second electrical connection 272 penetrating through the interlayer dielectric layer 270 to connect the source region 201 to the metal layer 274, the third electrical connections 273 penetrating through the interlayer dielectric layer 270 to connect the drain regions 202 to the metal layer 274 and the first electrical connections 271 being electrically connected to the second electrical connection 272 via the metal layer 274. Specifically, the formation of the electrical connections for external connection of the control gates 241 in the first and second gate structures, the source region 201 and the drain regions 202 may be accomplished by etching the interlayer dielectric layer 270 to form therein contact holes in which the control gates 241 in the first and second gate structures, the source region 201 and the drain regions 202 are exposed and then filling the contact holes with a conductive material such as tungsten, cobalt or another metal material. It is to be noted that, in other embodiments of the present invention, the control gates in the first and second gate structures and the source region may also be connected otherwise as practically required, and the present invention is not limited in this regard.

The method of the present invention is simple and designed to circumvent additional photomask costs. It is to be noted that, in other embodiments of the present invention, modifications can be made, as practically required, to the above steps and other details of the method for fabricating the split-gate memory device. Compared with the prior art, externally connecting the exposed control gates in the first and second gate structures and the source region using the abode discussed electrical connections according to the present embodiment results in area savings of the memory cell region by eliminating the need for reserving a separate wiring space in the memory cell region for the control gates and dispenses with the use of a peripheral control gate decoder circuit, thus allowing a simplified circuit design.

In summary, the present invention provides a split-gate memory device and a method for forming such a device. A substrate in the split-gate memory device has a memory cell region including a connecting subregion and a functional subregion. On the substrate, there are provided first and second gate structures that are mirrored to each other, and there is a source region in the substrate between the first and second gate structures. In the connecting subregion, control gates of the first and second gate structures and the source region are electrically connected by electrical connections. In the split-gate memory device of the present invention, the arrangement of the functional and connecting subregions in the memory cell region and external connection of the control gates in the first and second gate structures and the source region, which are exposed by etching, by the electrical connections in the connecting subregion result in area savings of the memory cell region by eliminating the need for reserving a separate wiring space in the memory cell region for the control gates and dispense with the use of a peripheral control gate decoder circuit, thus achieving a simplified circuit design, when compared with the prior art. Moreover, the method of the present invention is simple and designed to circumvent additional photomask costs.

Presented above are merely a few preferred embodiments of the present invention, which do not limit the invention in any way. Changes in any forms made to the principles and teachings disclosed herein, including equivalents and modifications, by any person of ordinary skill in the art without departing from the scope of the invention are intended to fall within the scope of the invention.

LIST OF REFERENCE NUMERALS IN DRAWINGS

100—substrate; 111, 112—floating gate; 121, 122—control gate; 130—erase gate; 141, 142—word line;
200—substrate; 201—source region; 202—drain region; 210—second dielectric layer; 211—gate oxide layer;
220—floating gate material layer; 221—floating gate; 230—first dielectric layer; 231—inter—gate dielectric layer;
240—control gate material layer; 241—control gate;
250—hard mask layer; 251—first opening; 252—second opening; 253—third opening;
260—erase gate; 261—erase gate protective layer;
270—interlayer dielectric layer; 271—first electrical connection; 272—second electrical connection; 273—third electrical connection; 274—metal layer;
280—word line; 281—word line spacer;
290—protective layer; 291—first spacer; 292—second spacer; 293—third spacer;
X—memory cell region; X1—connecting subregion; X2—functional subregion.

What is claimed is:

1. A split-gate memory device, comprising:
a substrate, having a memory cell region comprising a connecting subregion and a functional subregion;
first and second gate structures provided in the memory cell region, each of the first and second gate structures comprising a floating gate above the substrate, an inter-gate dielectric layer on the floating gate and a control gate on the inter-gate dielectric layer, the second gate structure being mirrored to the first gate structure;
a source region provided in the substrate between the first and second gate structures; and
electrical connections, including a first electrical connection region and a second electrical connection region separate from the first electrical connection region,
wherein in the connecting subregion, the first electrical connection region connects the control gate, the second electrical connection region connects the source region, and the first electrical connection region is electrically connected to the second electrical connection region,
wherein each of the first and second gate structures further comprises a first spacer and a second spacer, the first spacer residing on the inter-gate dielectric layer and covering a side of the control gate close to the source region, the second spacer residing on the substrate and covering a side of each of the first spacer, the control gate and the inter-gate dielectric layer close to the source region,
wherein each of the first and second gate structures further comprises a third spacer which covers a side of each of the floating gate, the inter-gate dielectric layer and the control gate away from the source region, and
wherein in the functional subregion, a protective layer is provided on the control gate of each of the first and second gate structures, the protective layer being in a shape of a wedge having a vertical surface away from the source region and a bevel surface close to the source region, the bevel surface covered partially by the first spacer and partially by the second spacer, the vertical surface covered by the third spacer.

2. The split-gate memory device of claim 1, wherein in the functional subregion, the second spacer further covers a surface of the substrate between the first and second gate structures.

3. The split-gate memory device of claim 2, wherein in the functional subregion, an erase gate is provided on the second spacer between the first and second gate structures.

4. The split-gate memory device of claim 3, wherein in the functional subregion, an erase gate protective layer is formed on the erase gate.

5. The split-gate memory device of claim 1, wherein in the functional subregion, each third spacer is covered by a word line and a word line spacer.

6. The split-gate memory device of claim 5, wherein in the functional subregion, a drain region is formed in the substrate on a side of the word line away from the source region.

7. The split-gate memory device of claim 6, wherein the electrical connections further include a third electrical connection region connecting the drain region.

8. The split-gate memory device of claim 7, further comprising an interlayer dielectric layer and a metal layer residing on the interlayer dielectric layer, the interlayer dielectric layer covering the substrate, the first gate structure and the second gate structure, wherein the first electrical connection region penetrates through the interlayer dielectric layer to connect the respective control gate to the metal layer, wherein the second electrical connection region penetrates through the interlayer dielectric layer to connect the source region to the metal layer, wherein the third electrical connection region penetrates through the interlayer dielectric layer to connect the respective drain region to the metal layer, and wherein the first electrical connection region is electrically connected to the second electrical connection region via the metal layer.

9. The split-gate memory device of claim 1, wherein a gate oxide layer is further formed between the floating gate in each of the first and second gate structures and the substrate.

* * * * *